United States Patent
Brady

(10) Patent No.: US 10,483,447 B2
(45) Date of Patent: Nov. 19, 2019

(54) STRUCTURES, SYSTEM AND METHOD FOR CONVERTING ELECTROMAGNETIC RADIATION TO ELECTRICAL ENERGY

(71) Applicant: Patrick K Brady, Glen Ellyn, IL (US)

(72) Inventor: Patrick K Brady, Glen Ellyn, IL (US)

(73) Assignee: Redwave Energy, Inc., Boulder, CO (US)

( * ) Notice: Subject to any disclaimer, the term of this patent is extended or adjusted under 35 U.S.C. 154(b) by 0 days.

(21) Appl. No.: 14/187,175

(22) Filed: Feb. 21, 2014

(65) Prior Publication Data

US 2016/0126441 A1    May 5, 2016

Related U.S. Application Data

(60) Provisional application No. 61/768,109, filed on Feb. 22, 2013.

(51) Int. Cl.
*H01L 35/32* (2006.01)
*H02S 10/30* (2014.01)

(52) U.S. Cl.
CPC .............. *H01L 35/32* (2013.01); *H02S 10/30* (2014.12)

(58) Field of Classification Search
CPC ......... H01L 35/30; H01L 35/32; H01L 35/34; H01L 35/35; H02S 10/30; H02S 10/10; H02S 40/425; H02S 40/44; F02C 6/18
USPC .................................................. 136/200, 253
See application file for complete search history.

(56) References Cited

U.S. PATENT DOCUMENTS

| | | | |
|---|---|---|---|
| 2,498,461 A | 2/1950 | Skellett | |
| 4,888,061 A | 12/1989 | Wenz | |
| 5,043,739 A | 8/1991 | Logan et al. | |
| 5,450,053 A | 9/1995 | Wood | |
| 6,489,553 B1 * | 12/2002 | Fraas | H02S 10/30 136/246 |
| 6,534,784 B2 | 3/2003 | Eliasson et al. | |
| 7,436,373 B1 | 10/2008 | Lopes et al. | |
| 7,792,644 B2 | 9/2010 | Kotter et al. | |
| 8,071,931 B2 | 12/2011 | Novack et al. | |
| 8,115,683 B1 * | 2/2012 | Stefanakos | H01Q 1/248 136/255 |
| 8,283,619 B2 | 10/2012 | Novack et al. | |

(Continued)

FOREIGN PATENT DOCUMENTS

| | | |
|---|---|---|
| DE | 102008043346 | 5/2010 |
| JP | 2002-78365 | 3/2002 |

OTHER PUBLICATIONS

Kotter, D., et al., "Theory and Manufacturing Processes of Solar Nanoantenna Electromagnetic Collectors", The Journal of Solar Energy Engineering, Feb. 2010, vol. 132.

(Continued)

*Primary Examiner* — Jeffrey T Barton
*Assistant Examiner* — Daniel P Malley, Jr.
(74) *Attorney, Agent, or Firm* — Fitzgerald & Isaacson, LLP; David C. Isaacson

(57) ABSTRACT

A substrate, resonant structures, a ground plane, a thermal optimization layer and energy transfer structures are combined to receive and convert incoming electromagnetic radiation into electrical energy. This combination of materials may be housed in various configurations near heat sources to maximize surface area for heat contact as well as cooling. All structures are designed so as to be manufactured in low cost processes such as roll to roll.

18 Claims, 12 Drawing Sheets

(56) References Cited

U.S. PATENT DOCUMENTS

| | | | |
|---|---|---|---|
| 8,847,824 | B2 | 9/2014 | Kotter et al. |
| 8,901,507 | B2 | 12/2014 | Kotter |
| 2003/0128919 | A1 | 7/2003 | Weiss et al. |
| 2006/0210279 | A1 | 9/2006 | Hills et al. |
| 2006/0283539 | A1 | 12/2006 | Slafer |
| 2008/0060455 | A1 | 3/2008 | Coyle |
| 2009/0026434 | A1 | 1/2009 | Malhotra et al. |
| 2009/0125254 | A1 | 5/2009 | Kotter et al. |
| 2009/0133734 | A1 | 5/2009 | Takahashi |
| 2010/0045924 | A1 | 2/2010 | Powers et al. |
| 2010/0270967 | A1 | 10/2010 | Cho et al. |
| 2010/0284086 | A1 | 11/2010 | Novack et al. |
| 2010/0307580 | A1 | 12/2010 | Carroll et al. |
| 2010/0319749 | A1 | 12/2010 | Greiff et al. |
| 2011/0062329 | A1 | 3/2011 | Ben-Bassat |
| 2011/0164308 | A1 | 7/2011 | Arsenault et al. |
| 2011/0277805 | A1 | 11/2011 | Novack et al. |
| 2011/0315880 | A1 | 12/2011 | Nemirovsky |
| 2012/0080073 | A1 | 4/2012 | Kotter et al. |
| 2013/0009851 | A1 | 1/2013 | Danesh |
| 2013/0146117 | A1 | 6/2013 | Brady |
| 2013/0249771 | A1 | 9/2013 | Kotter et al. |
| 2014/0172374 | A1 | 6/2014 | Brady |
| 2015/0303335 | A1 | 10/2015 | Kotter |

OTHER PUBLICATIONS

Monacelli B., et al., "Infrared frequency selective surface based on circuit-analog square loop design," IEEE Transactions on Antennas and Propagation, vol. 53, No. 2, pp. 745-752, Feb. 2005.
Notification of Transmittal of International Search Report and Written Opinion of International Searching Authority dated Feb. 15, 2013 in PCT App. No. PCT/US2012/068561, filed Dec. 7, 2012.
International Search Report dated Feb. 15, 2013 in PCT App. No. PCT/US2012/068561, filed Dec. 7, 2012.
Written Opinion of the International Searching Authority dated Feb. 15, 2013 in PCT App. No. PCT/US2012/068561, filed Dec. 7, 2012.
Celanovic, I., et al. "Two-dimensional tungsten photonic crystals as selective thermal emitters," Applied Physics Letters 92, pp. 193101-1-3 (2008).
Notification of Transmittal of International Search Report and Written Opinion of International Searching Authority dated Aug. 15, 2014 in PCT App. No. PCT/US2014/017843, filed Feb. 21, 2014.
International Search Report dated Aug. 15, 2014 in PCT App. No. PCT/US2014/017843, filed Feb. 21, 2014.
Written Opinion of the International Searching Authority dated Aug. 15, 2014 in PCT App. No. PCT/US2014/017843, filed Feb. 21, 2014.
Kotter et al., "Lithographic Antennas for Enhancement of Solar-Cell Efficiency," Idaho Nat'l Eng'g. Lab., INEE/EXT-98-00389, Apr. 1998, 26 pages.
Extended European Search Report in European App. No. 12855658.6 dated Jul. 20, 2015.
Kotter et al., "Theory and manufacturing processes of solar nanoantenna electromagnetic collectors," Journal or Solar Energy Engineering, ASME International US, vol. 132, No. 1, Feb. 1, 2010 (Feb. 1, 2010), pp. 11014-1-11014-9.
Remski et al., "Frequency Selective Surfaces, Design and Analysis Using the Ansoft Produce Suite," Ansoft Corp., Presentation #4, 34 pages, 2000.
International Search Report for International Application No. PCT/US2013/077561 dated Mar. 27, 2015, 2 pages.
International Written Opinion for International Application No. PCT/US2013/077561 dated Mar. 27, 2015, 2 pages.
Notification of Transmittal of International Search Report and Written Opinion of International Searching Authority, or the Declaration dated Sep. 4, 2015 in PCT App. No. PCT/US2015/036817, filed Jun. 19, 2015.
International Search Report dated Sep. 4, 2015 in PCT App. No. PCT/US2015/036817, filed Jun. 19, 2015.
Written Opinion of the International Searching Authority dated Sep. 4, 2015 in PCT App. No. PCT/US2015/036817, filed Jun. 19, 2015.
U.S. Appl. No. 60/987,630, filed Nov. 13, 2007, titled, "Antenna Devices Comprising Flexible Substrates, Related Structures, and Methods of Making and Using the Same," to Pinhero et al.
Office Action dated Feb. 7, 2017 in U.S. Appl. No. 13/708,481, filed Dec. 7, 2012.
Chinese Patent Office: Search report dated Dec. 17, 2015 in Chinese Patent App. No. 201280060548.4 (in Chinese).
Chinese Patent Office: Notice of first office action dated Dec. 17, 2015 in Chinese Patent App. No. 201280060548.4 (in Chinese), 2 pages.
Chinese Patent Office: content of first office action dated Dec. 17, 2015 for Chinese patent app. No. Patent App. No. 201280060548.4 (in Chinese) .
Chinese Patent Office: content of first office action dated Dec. 17, 2015 in Chinese Patent App. No. 201280060548.4 (in English for portion for which translation was available).
Chinese Patent Office: Notice of second office action dated Aug. 1, 2016 for Chinese patent app. No. Patent App. No. 201280060548.4 (in Chinese).
Chinese Patent Office: content of second office action dated Aug. 1, 2016 for Chinese patent app. No. Patent App. No. 201280060548.4 (in Chinese).
Chinese Patent Office: content of second office action dated Dec. 17, 2015 in Chinese Patent App. No. 201280060548.4 (in English for portion for which translation was available).
Office Action dated May 5, 2015 in U.S. Appl. No. 13/708,481, filed Dec. 7, 2012.
Office Action dated Dec. 15, 2015 in U.S. Appl. No. 13/708,481, filed Dec. 7, 2012.
Office Action dated Jul. 15, 2016 in U.S. Appl. No. 13/708,481, filed Dec. 7, 2012.
Office Action dated Feb. 7, 2016 in U.S. Appl. No. 13/708,481, filed Dec. 7, 2012.
Australian Patent Office: Patent Examination Report No. 1 dated May 6, 2016 in Australian Patent Application 2012347504.
Machine translation of DE 102008043346 (Robert Bosch GmbH) (May 6, 2010) (FPL1).
Boniche, Israel, et al., "Micromachined Radial Thermoelectric Modules for Power Generation Using Hot Gas Streams", Journal of Microelectomechanical Systems, vol. 20, No. 2, p. 512-521 (Apr. 2011).
Office Action dated Jun. 23, 2017 in U.S. Appl. No. 13/708,481, filed Dec. 7, 2012.
Chinese Patent Office: content of third office action dated Feb. 13, 2017 for Chinese patent app. No. Patent App. No. 201280060548.4 (in Chinese).
Chinese Patent Office: content of third office action dated Feb. 13, 2017 in Chinese Patent App. No. 201280060548.4 (in English for portion for which translation was available).
Chinese Patent Office: Notice of third office action dated Feb. 13, 2017 in Chinese Patent App. No. 201280060548.4 (in Chinese).
Chinese Patent Office: notice of rejection dated Aug. 17, 2017 for Chinese patent app. No. Patent App. No. 201280060548.4 (in Chinese).
Chinese Patent Office: notice of rejection dated Aug. 17, 2017 in Chinese Patent App. No. 201280060548A (in English for portion for which translation was available).
Chinese Patent Office: content of fourth office action dated May 10, 2018 for Chinese patent app. No. Patent App. No. 201280060548.4 (in Chinese).
Chinese Patent Office: content of fourth office action dated May 10, 2018 in Chinese Patent App. No. 201280060548.4 (in English for portion for which translation was available).
Chinese Patent Office: Notice of fourth office action dated May 10, 2018 in Chinese Patent App. No. 201280060548.4 (in Chinese).
Shelton, et al., "Gangbuster frequency selective surface metamaterials in terahertz band," Elctronics Letters, vol. 44, No. 22, pp. 1-2 (Oct. 23, 2008).
Canadian Patent Office: Office Action dated Aug. 29, 2018 in CA Pat. App. No. 2,858,375.

(56) References Cited

OTHER PUBLICATIONS

Japanese Patent Office: Office Action dated Jul. 17, 2018 in JP Pat. App. No. 2017-139220 (in Japanese).
Japanese Patent Office: Office Action dated Jul. 17, 2018 in JP Pat. App. No. 2017-139220 (in English for portion which translation was available).
JP 2002-78365 (Toyota Motor Company) (Mar. 15, 2002) (Machine translation to English).
Japanese Patent Office: Office Action dated Dec. 2, 2016 in JP Pat. App. No. 2014-546142 (in Japanese).
Japanese Patent Office: Office Action dated Dec. 2, 20186in JP Pat. App. No. 2014-546142 (in English for portion for which translation was available).
Advisory Action dated Apr. 18, 2017 in U.S. Appl. No. 13/708,481, filed Dec. 7, 2012.
Yunsong, Xie, et al., "A Universal Electromagnetic Energy Conversion Adaptr Based on a Metamaterial Absorber".

* cited by examiner

STRUCTURES, SYSTEM AND METHOD FOR CONVERTING ELECTROMAGNETIC RADIATION TO ELECTRICAL ENERGY

This application claims the benefit of U.S. Provisional Patent App. No. 61/768,109, filed Feb. 22, 2013, which is hereby incorporated by reference in its entirety.

BACKGROUND

Field of the Invention

Embodiments of the present invention relate generally to structures and methods for harvesting energy from electromagnetic radiation. More specifically, embodiments relate to systems for harvesting electromagnetic energy from, for example, infrared and near infrared (such as heat) and visible spectrums and capturing Terahertz energy.

Background of the Invention

There is a great need for inexpensive renewable energy in the world. Ironically, there is an abundance of energy available in the form of sunlight and heat. Using such energy to support modern living, however, requires that energy be converted into electrical form. In fact, most electrical energy used today comes from a conversion process involving heat. For example, nuclear, coal, diesel, and natural gas powered electrical generation plants all convert stored forms of energy into electricity. Unfortunately, the conversion processes used in these plants are inefficient, and often produce more heat as waste than is converted into electricity.

In addition to higher efficiency, harvesting sources of heat into usable electrical power is especially desirable at low cost. Conventional turbine-based solutions for generating electricity from heat are expensive. However, such systems have been employed for years, and are now mature. As a result, new technological solutions to convert heat to electrical power must provide sufficient improvement to overcome the status quo of turbine-based systems. Despite the maturity of turbine-based systems, high cost and greater demand for electricity make new technologies that convert heat to electricity more efficiently and at lower cost increasingly attractive. Among the new technologies being studied are thermo photovoltaic (TPV), thermoelectric (TE) and at lower temperatures organic rankine cycle (ORC).

TPV technology faces a number of hurdles in converting heat to electricity. Chief among them is that photovoltaic techniques convert short wave radiation to electricity, not the comparatively long waves of the IR and near IR spectra associated with heat. New micron gap methods to bring this long wave energy to the operating regions of a PV cell still require conversion technology better suited to the influx of long wave radiation and thus are suitable only at the highest temperature sources.

In general, the PV cell band gap favors only energetic photons since lower energy photons do not have the energy to cross the gap. As a result, these photons are absorbed by the PV cell, and cause heat in the cell itself.

Thermoelectric (TE) solutions, to date, have only been able to convert heat to electrical power at low efficiency. As a result, conventional TE solutions have not provided substantial efficiencies in energy conversion. Even so, TE has found application in automotive waste heat recovery, which further evidences the need for alternative heat-to-electric conversion technologies.

Organic Rankine Cycle (ORC) and related technologies harvest waste heat by chaining turbines together with each successive system in the chain using a lower boiling point liquid. ORC system have a number of drawbacks. They are bulky, have large numbers of moving parts, contain chemicals that are undesirable on customer sites and are limited to the properties of the liquids in the system. Ultimately they suffer from limits of conversion time, space, and the diminishing returns of additional systems in a working space.

These and other problems with conventional techniques for harvesting electrical energy from heat require a solution with greater efficiency and lower costs.

BRIEF SUMMARY OF THE INVENTION

In an embodiment, a system for harvesting electrical energy from electromagnetic energy or radiation, such as heat emitted by a heat source, comprises a nanoantenna electromagnetic collector (NEC) film of collector/converter devices that collect heat radiation emanating from a heat source, and convert that heat radiation to electrical energy. In an embodiment, the collector/converter devices comprise a rectenna and a back plane. The generated electricity can then be supplied to a load.

It is important to supply a heat differential to just the collector/converter devices, and not allow the heat source to become generally cooled. To optimize heat transfer from the heat source to the collector/converter device, an embodiment of the system includes an optimization layer that allows cooling of the converter elements of the collector/converter devices but insulation of the other areas of the surface.

In an embodiment where the collectors/converter devices produce DC current, a power inverter can be used to convert the generated DC current to AC current to supply to a load.

In an embodiment, the optimization layer is an overcoat of two materials—one that is highly insulating and another that is highly conducting of heat. Insulating materials are placed so as to block heat flow to regions of the NEC film that do not contain collector/converter devices. Heat conducting materials are placed so as to allow heat flow to the collector/converter devices.

In an embodiment, the resonant elements of the collector/converter devices comprise electrically conductive material coupled with a transfer structure to convert electrical energy stimulated in the resonant element to direct current. Exemplary such resonant elements are described in more detail in U.S. Pat. No. 7,792,644, entitled, "Methods, computer readable media, and graphical user interfaces for analysis of frequency selective surfaces" and U.S. Pat No. 6,534,784, entitled, "Metal-oxide electron tunneling device for solar energy conversion", and U.S. Patent App. Pub. Nos. 2010/0284086, entitled, "Structures, Systems and Methods for Harvesting Energy from Electromagnetic Radiation", and 2006/0283539, entitled, "Systems and methods for roll-to-roll patterning" each of which is incorporated by reference herein in its entirety.

Embodiments of the invention are shown that allow new design or, alternately, retrofit to industrial waste heat sources. These embodiments share some similarity to heat exchangers but operate from a completely different principle. Heat exchangers attempt to transfer heat from one region to another without exchanging actual material. Embodiments of the present invention, on the other hand, put hot and cold in proximity for the purpose of converting heat to electricity. This is done with as little exchange of heat as possible. In effect a new device is created—a Heat-to-Electricity Exchanger (HExchanger).

In one embodiment an HExchanger is retrofit to a surface condenser/heat exchanger. Tubes carrying a hot material, such as hot gas or hot liquid, are covered with fins that include a thermal conductive material, which maximize surface area between hot and cold. In an embodiment, fins are covered with NEC film to facilitate electrical conversion. In an embodiment, fins are surrounded by or in contact with cold material.

In another embodiment an HExchanger is designed to replace traditional conventional tube condenser/heat exchanger. To maximize surface area, layers of alternating hot and cold surfaces are created whereby NEC film covers the interface between layers.

In another embodiment a heated wall is covered with fin appliances that conduct heat away from the wall and into the core of the appliance. Fins are covered with NEC film to facilitate conversion of heat to electricity.

In another embodiment flue gas from a coal or gas electrical generation plant is vented through a stack designed to maximize HExchange. This stack is composed of a plurality of substacks so as to increase surface area covered with NEC film.

In another embodiment of the invention hot steam or water exiting a turbine is passed through an HExchanger that acts to cool and condense steam as well as generate additional electricity from the wasted heat.

In an embodiment, the present invention is a system for converting electromagnetic energy into electricity that includes a composite stack, the composite stack comprising at least one composite stack ring, the composite stack ring having a plurality of elements, each element comprising at least one layer, wherein at least one layer converts the electromagnetic energy to electricity.

In another embodiment, the present invention is a method for converting electromagnetic radiation into electricity comprising absorbing electromagnetic radiation from an element in a composite stack ring of a composite stack and converting the absorbed electromagnetic radiation into electricity in a layer in the element.

In another embodiment, the present invention is a system to harvest electrical energy that includes a collector/converter that contains a plurality of collector/converter devices that convert electromagnetic radiation to electricity and a cool source to cool the collector/converter devices.

All embodiments discussed may operate with passive or active cooling and with liquid or gas (except where condensing to a new state is involved or required).

Embodiments may be used in any application to convert heat to electricity such as waste heat from coal power plants or even replacing the turbine in electrical generation applications.

Additional features and embodiments of the present invention will be evident in view of the following drawings and detailed description of the invention.

DETAILED DESCRIPTION

The following description is presented to enable one of ordinary skill in the art to make and use the invention and is provided in the context of a patent application and its requirements. Various modifications to the described embodiments will be readily apparent to those skilled in the art and the generic principles herein may be applied to other embodiments. Thus, the present invention is not intended to be limited to the embodiments shown but is to be accorded the widest scope consistent with the principles and features described herein.

Figure 1:
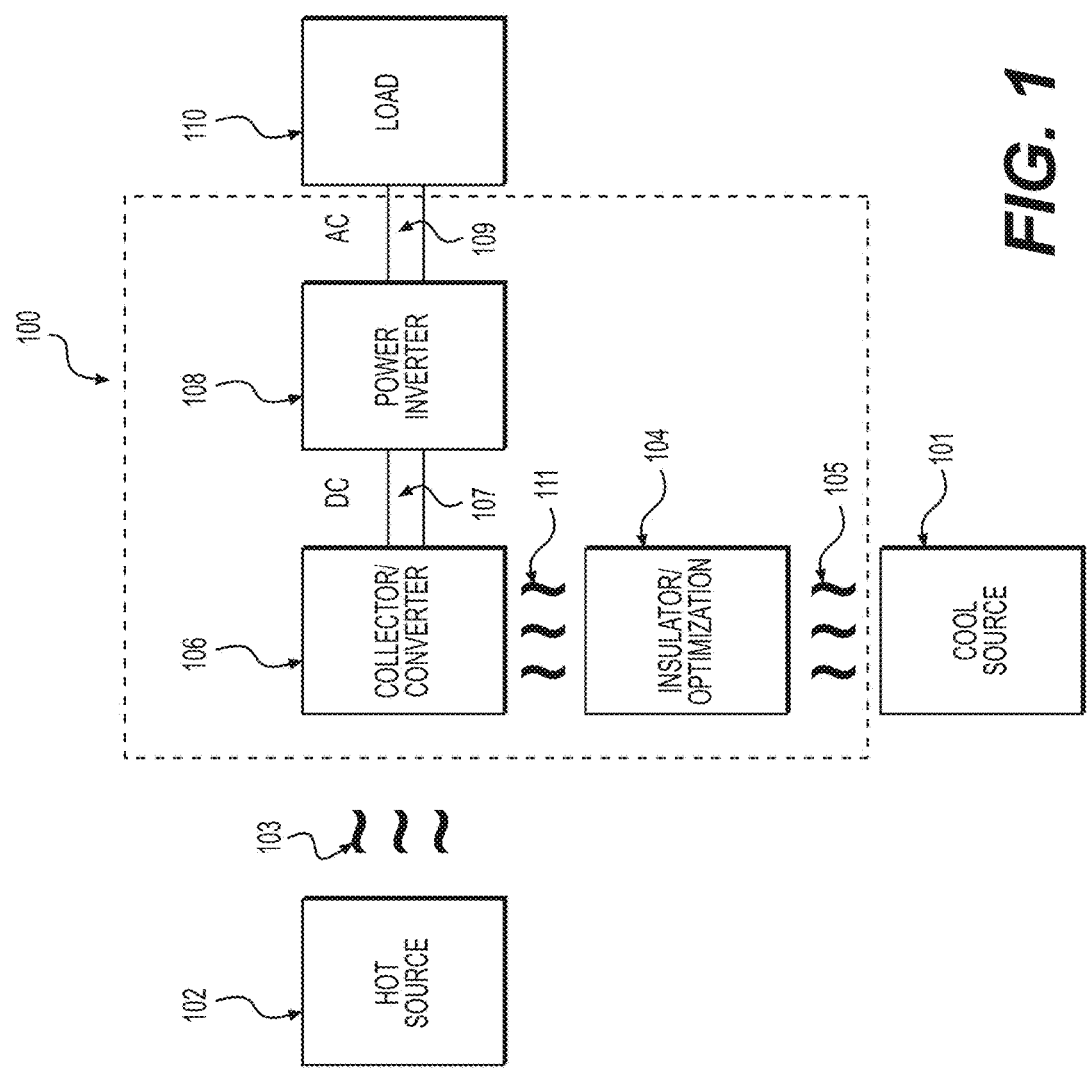
FIG. 1 is a schematic diagram of a system for harvesting energy from a heat source and supplying the generated electricity to a load according to an embodiment of the present invention.

FIG. 1 is a schematic diagram of a system 100 for harvesting electromagnetic energy or radiation to generate electricity, and supplying the generated electricity to a load 110. In an embodiment, the electromagnetic energy or radiation is provided by a heat source 102. A collector/converter device 106 collects heat provided by heat source 102 and converts that heat to electricity and to AC via power converter 108 to be supplied to load 110. Conversion to AC is optional as some applications may require direct DC.

In an embodiment, an insulator optimization layer 104 is interposed between cool source 101 and collector/converter device 106. Insulator optimization layer 104 serves to optimize heat transfer from heat source 102 to collector/converter 106 to make converting heat generated by source 102 to electricity by collector/converter device 106 more efficient. In an embodiment, insulator optimization layer 104 operates by selectively allowing access to the cool source 101 where needed at converter elements of collector/converter 106 and insulating elsewhere. Cool source 101 can be any cooling source including, depending upon embodiment, a cooling material, ambient air, or other cooling sources.

In an embodiment, collector/converter 106 comprises a plurality of collector/converter devices, for example, nano-antenna electromagnetic collector (NEC) devices. Each NEC device comprises a resonant structure that is tuned to heat frequencies, and generates an electric current in the presence of electromagnetic energy from heat sources. In an embodiment, a transfer structure converts electrical energy stimulated in the resonant elements of the resonant structure to DC current. In an embodiment, the transfer structure is a metal insulator metal (MIM) diode. In an embodiment, collector/converter 106 comprises a film that contains a high density of NEC devices that cover the surface of the film. A film so constructed is referred to as a NEC film.

In an embodiment collector/converter 106 supplies DC current. In such embodiment, a power inverter 108 can be used to generated AC current. In such an embodiment, collector/converter 106 can be coupled to power inverter 108 using a bus 107. Power inverter 108 then supplies load 110 with AC current over bus 109. In such embodiment, therefore, electrical current is generated by collector/converter 106 that receives and rectifies radiant energy from heat sources. In an embodiment, collector converter 106 includes a plurality of NEC devices that receive and rectify radiant energy from heat sources. DC current from collector/converter 106 is delivered to power inverter 108 to convert the DC current to AC current that is ultimately delivered to load 110.

Figure 2:
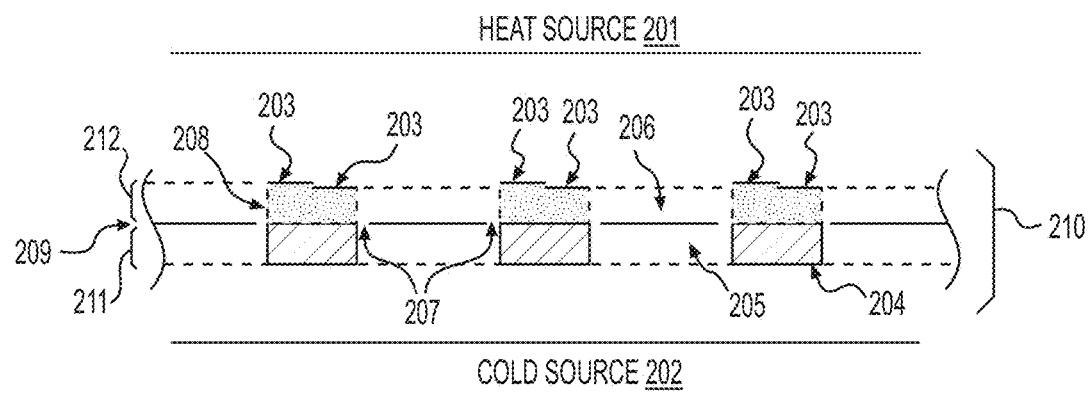
FIG. 2 is a schematic diagram that illustrates detail of a NEC film and insulator optimization layers according to an embodiment of the present invention.

FIG. 2 is a schematic diagram that illustrates detail of a NEC film 210 and the insulator optimization layer 211 and 212. A hot source 201 radiates to a layer of collector/converter devices. The collector/converter devices include rectennas 203. Radiation is either received and converted to electricity by rectennas 203, reradiated by the rectennas 203 back to hot source 201, or passes through rectenna 203 layer and is reflected back to the hot source 201 by a backplane 209.

Rectennas 203 are kept cool by thermal connectivity to a cold source 202. It is advantageous for areas around rectennas 203 to be insulated from cold source 202 so the majority of the heat in hot source 201 is harvested and not dispersed to cold source 202. In an embodiment, thermal control is managed by mapping of insulating material, such as insulating materials 205 and 206, to the regions outside rectennas 203. Insulating material in the region closest to cold source 202 may be both thermally insulating and IR blocking Insulating material in the region between antenna and backplane must be thermally insulating but IR transparent. An exemplary insulating material having these properties in a wide range of IR is Aerogel. Insulating materials 205 and 206 can be, but need not be, the same in an embodiment. Such preferential insulation of areas around the rectennas minimizes heat flow while maximizing harvesting of electrical energy from the heat.

In an embodiment, thermally conductive material provides a path to cooling for rectennas 203 as shown by conductive materials 204 and 208. Conductive material in the region closest to cold source 202 may be both thermally conductive and IR transparent. Conductive material in the region between antenna and backplane must be thermally conductive and IR transparent. An exemplary conductive material having these properties is silicon. Conductive materials 204 and 208 can be, but need not be, the same in an embodiment.

In an embodiment reflective backplane 209 does not include gaps 207 that separate regions of insulating and conductive materials to provide optimal thermal isolation. In another embodiment, reflective backplane 209 does include gaps 207.

Figure 3:
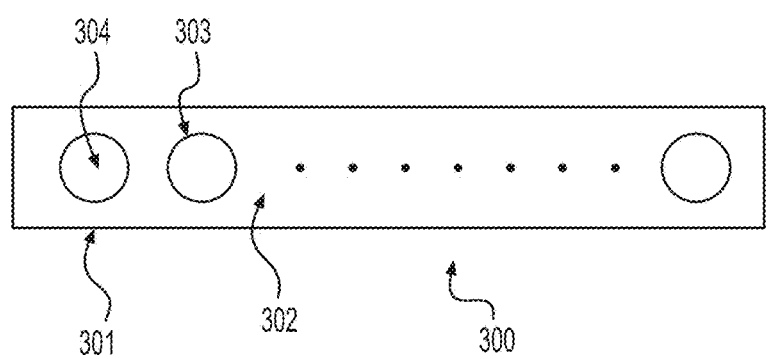
FIG. 3 illustrates a cross section of a conventional tube condenser heat exchanger that can be configured to provide heat to electricity conversion according to an embodiment of the present invention.

FIG. 3 illustrates a cross section of a conventional tube condenser heat exchanger 300. Casing 301 contains a material 302, such as liquid or gas, 302 that surrounds tubes (or pipes) 303. Tubes 303 contain a material 304, such as liquid or gas, at a different temperature. For purposes of this description material 304 in tubes 303 is hot and material 302 in casing 301 is cold. Proximity of cool material 302 to hot material 304 allows for exchange of thermal energy while the separation of the materials is maintained by the walls of the pipes 303.

Figure 5:
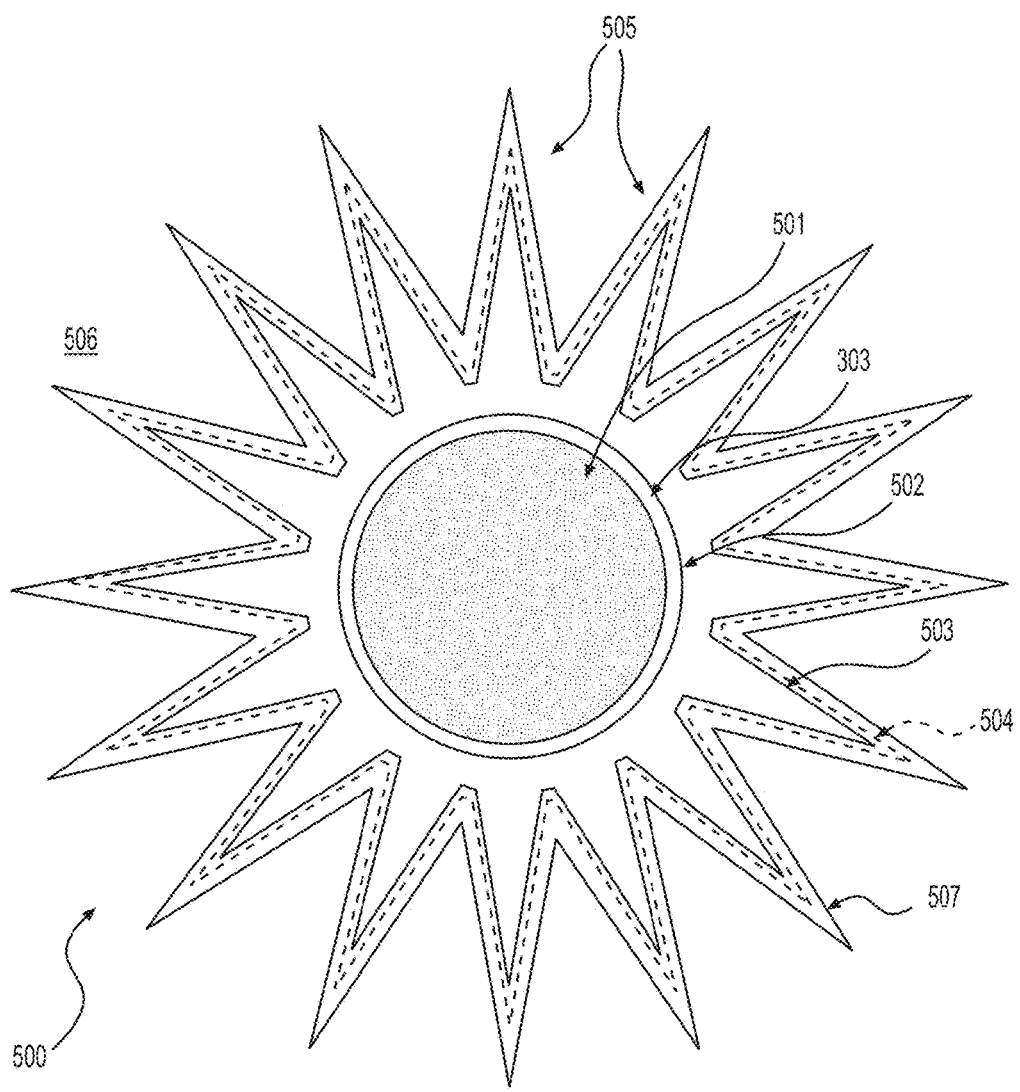
FIG. 5 illustrates a fin structure having a plurality of fins that surrounds pipes to increase the surface area to expose a plurality of collector/converter devices to heat.

FIG. 5 illustrates a fin structure 500 having a plurality of the fins 505 that surrounds pipes 303 to increase the surface area to expose a plurality of collector/converter devices to heat. In the embodiment shown in FIG. 5, the plurality of collector/converter devices are on a NEC film 504. As shown in FIG. 5, fin structure 500 includes a plurality of fins 505. Hot material 501 conducts its heat through a pipe wall 502 to thermally conductive core material 503 of the fins 505. Fins 505 are covered with NEC film 504 as shown in detail in FIG. 2. An environmental overcoat layer 507 protects the NEC film 504 from cool material 506 chemistry. Fin structure 500 around the pipes provides a retrofit method for increasing the surface area of the NEC film and thus increases the electrical heat conversion. Fin structure 500 can have any size, shape and/or number of fins 505 that fit around pipes 303 to increase the surface area to increase exposure of NEC film 504 to heat.

Figure 4:
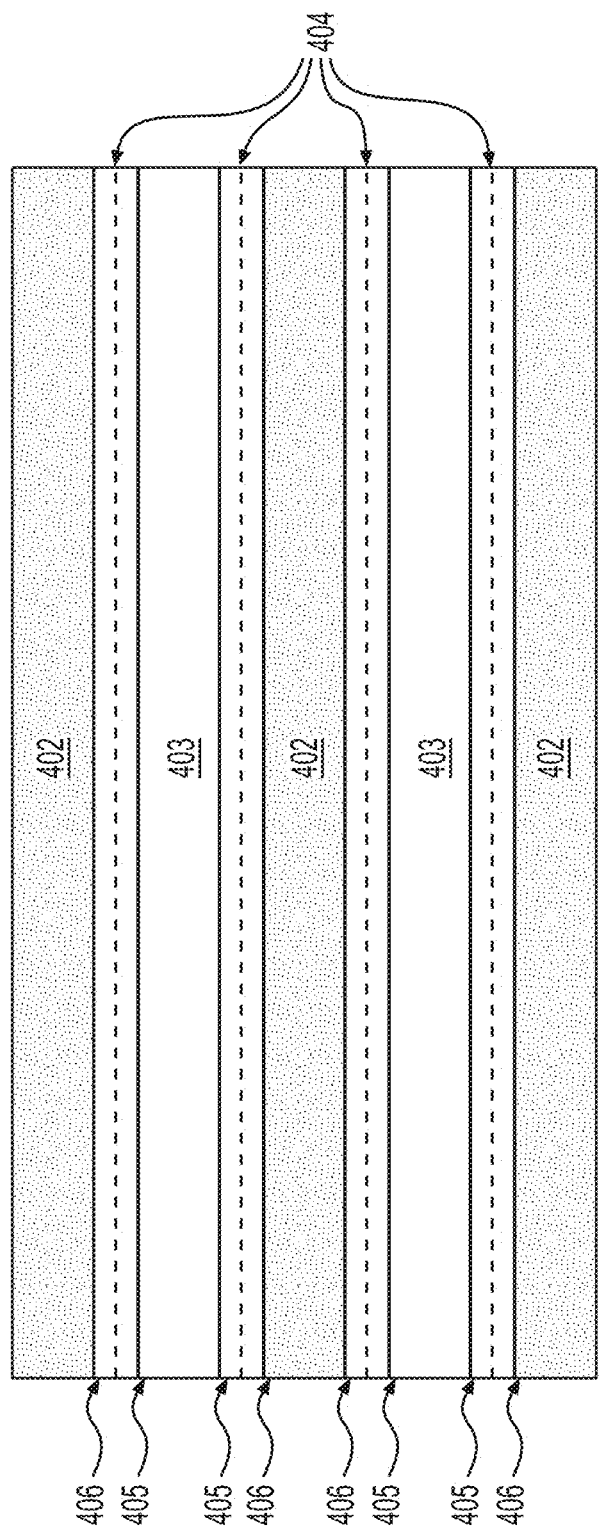
FIG. 4 illustrates another embodiment of the present invention configured as a layered HExchanger.

FIG. 4 illustrates another embodiment of the present invention that improves on the heat exchanger embodiment of FIG. 5 by redesigning the exchanger to be a layered HExchanger. FIG. 4 shows a cross section of a layered HExchanger. Alternating layers of hot material layer 402 and cold material layer 403 are separated by walls and NEC film. For example, a wall 406 separates hot material layer 402 from NEC film 404, and a wall 405 separates cold material layer 403 from NEC film 404. The embodiment of FIG. 4 can provide significantly greater surface area contact of NEC film and temperature differential. The thickness of layers can vary depending on temperatures and material properties (viscosity, thermal conductance, etc). Proper implementation of this embodiment will involve maximizing the number of alternate layers.

Figure 13:
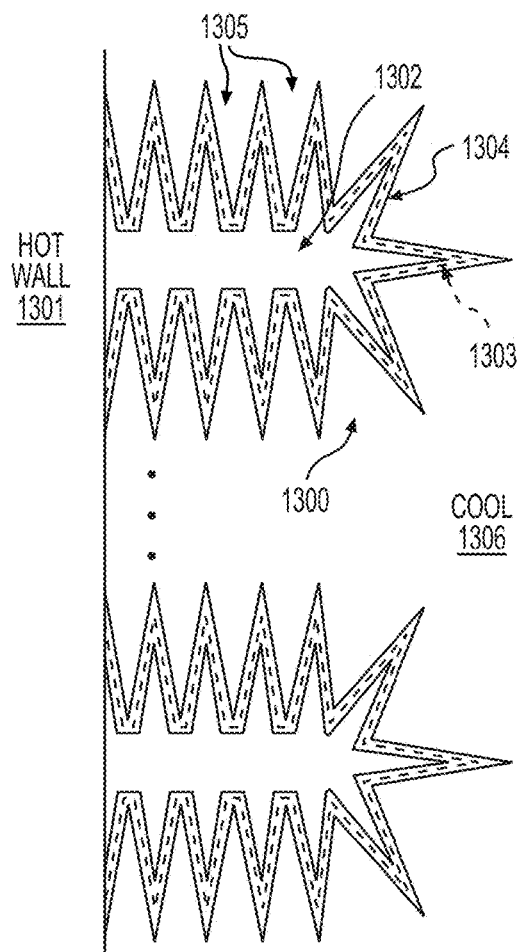
FIG. 13 illustrates another embodiment in which a heated surface, such as hot wall, provides the hot source to be harvested.

FIG. 13 illustrates another embodiment in which a heated surface, such as hot wall 1301, provides the hot source to be harvested. Simply coating hot wall 1301 with NEC film will provide limited electrical conversion. Conversion may be increased by installing a plurality of devices 1300 on hot wall 1301 as shown in FIG. 13. Device 1300 is shown in cross section and contains a conductive core material 1302 and fins 1305 coated with NEC film 1303 and environmental overcoat 1304. The increased surface proportionally increases the converted heat to electricity. Cooling may come from passive or active flow of material in addition to radiation from fins 1305 provided by cool area 1306. Fin structure 1300 can have any size, shape and/or number of fins 1305 that fit around pipes 303 to increase the surface area to increase exposure of NEC film 1303 to heat.

Figure 14:
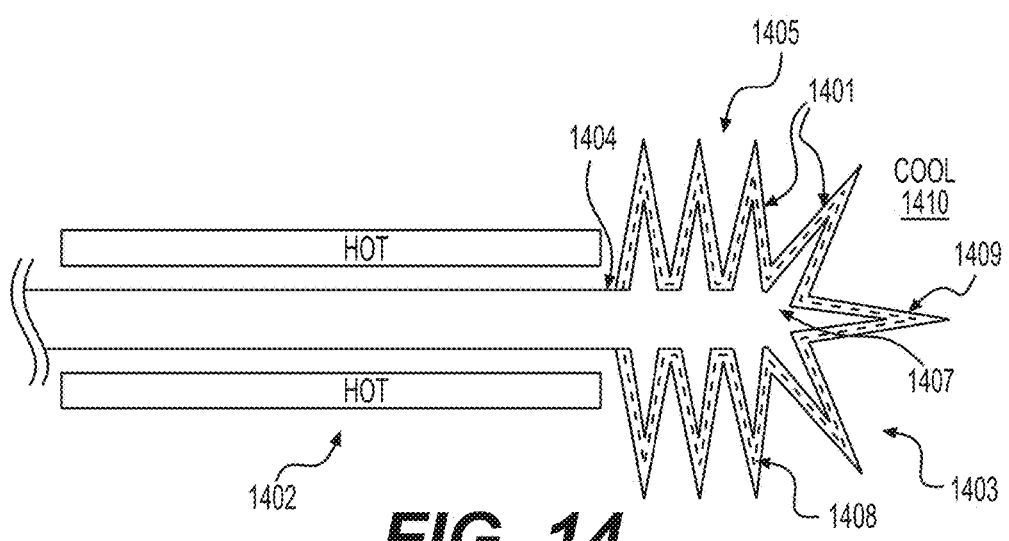
FIG. 14 illustrates another embodiment for converting heat to electricity using hot plates.

FIG. 14 illustrates another embodiment for converting heat to electricity using hot plates. As shown in FIG. 14, hot plates 1402 surround a cooling heat sink plate 1404. Finned structure 1403 having a plurality of fins 1401 and thermally conductive material 1407 is attached to cooling heat sink plate 1404 to form device 1405. A NEC film 1408 covers fins 1401. An environmental overcoat 1409 protects NEC film 1408. Cooling may come from passive or active flow of material in addition to radiation from the fins 1401 provided by cool area 1410. Fin structures 1403 can have any size, shape and/or number of fins 1401 to increase the surface area to increase exposure of NEC film 1408 to heat.

Figure 6:
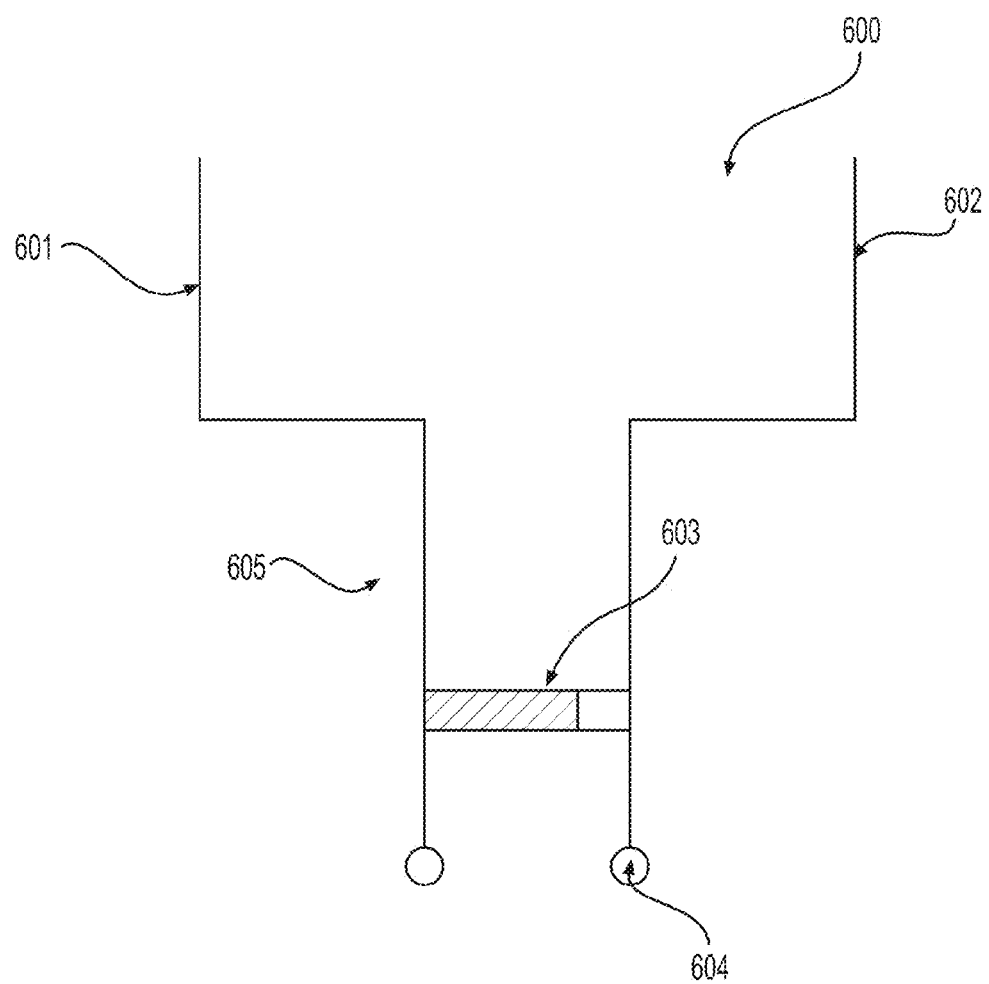
FIG. 6 is a schematic diagram of a resonant structure according to an embodiment of the present invention.

FIG. 6 is a schematic diagram of a resonant structure 600 according to an embodiment. Resonant structure 600 is also referred to as a Nanoantenna Electromagnetic Collector (NEC) device. Resonant structure 600 includes antenna components 601 and 602. Antenna components 601 and 602 are connected to transfer structure 603 by a co-planar strip 605. As referred to herein, a rectenna comprises antenna components 601 and 602 and transfer structure 603. Co-planar strip 605, which may or may not be necessary in a particular embodiment, creates a mechanism to match impedance between resonant structure elements 601 and 602 and transfer structure 603. In operation, current is delivered to downstream busses and circuits via contacts 604. Exemplary such NEC devices are described in U.S. Pat. No. 7,792,644, entitled, "Methods, computer readable media, and graphical user interfaces for analysis of frequency selective surfaces" and U.S. Pat. No. 6,534,784, entitled "Metal-oxide electron tunneling device for solar energy conversion", and U.S. Patent App. Pub. Nos. 2010/0284086, entitled, "Structures, Systems, and Methods for Harvesting Energy from Electromagnetic Radiation", 2006/0283539, entitled, "Systems and methods for roll-to-roll patterning", and 2013/0146117, entitled, "System and Method for Converting Electromagnetic Radiation to Electrical Energy", each of which is incorporated herein by reference in its entirety.

In embodiments the resonant elements (antenna elements 601 and 602) are embedded in a substrate. The resonant element and transfer structure pairs are arranged into arrays that are embedded in the substrate and interconnected so as to form the source for an electrical circuit. Additionally, the resonant elements may be connected to the transfer structures through a co-planar strip transmission line (CPS) or other device known in the art to balance the impedance between elements. Other methods of impedance matching may also be employed as discussed in U.S. Patent App. Pub. No. 2013/0146117, entitled, "System and Method for Converting Electromagnetic Radiation to Electrical Energy", which is hereby incorporated by reference in its entirety.

Also included is a ground plane of conductive material. Preferably, the ground plane is located at a distance of a quarter wavelength from the resonance elements to create a resonance gap to reflect unabsorbed radiation back to the resonance elements. All components, elements and substrates of this embodiment are composed of metals and materials that allow them to be manufactured in low cost methods such as roll-to-roll. The specific nature of heat harvesting environments may dictate high temperature tolerant substrate materials of limited flexibility that would alter the roll-to-roll production methods.

Figure 7:
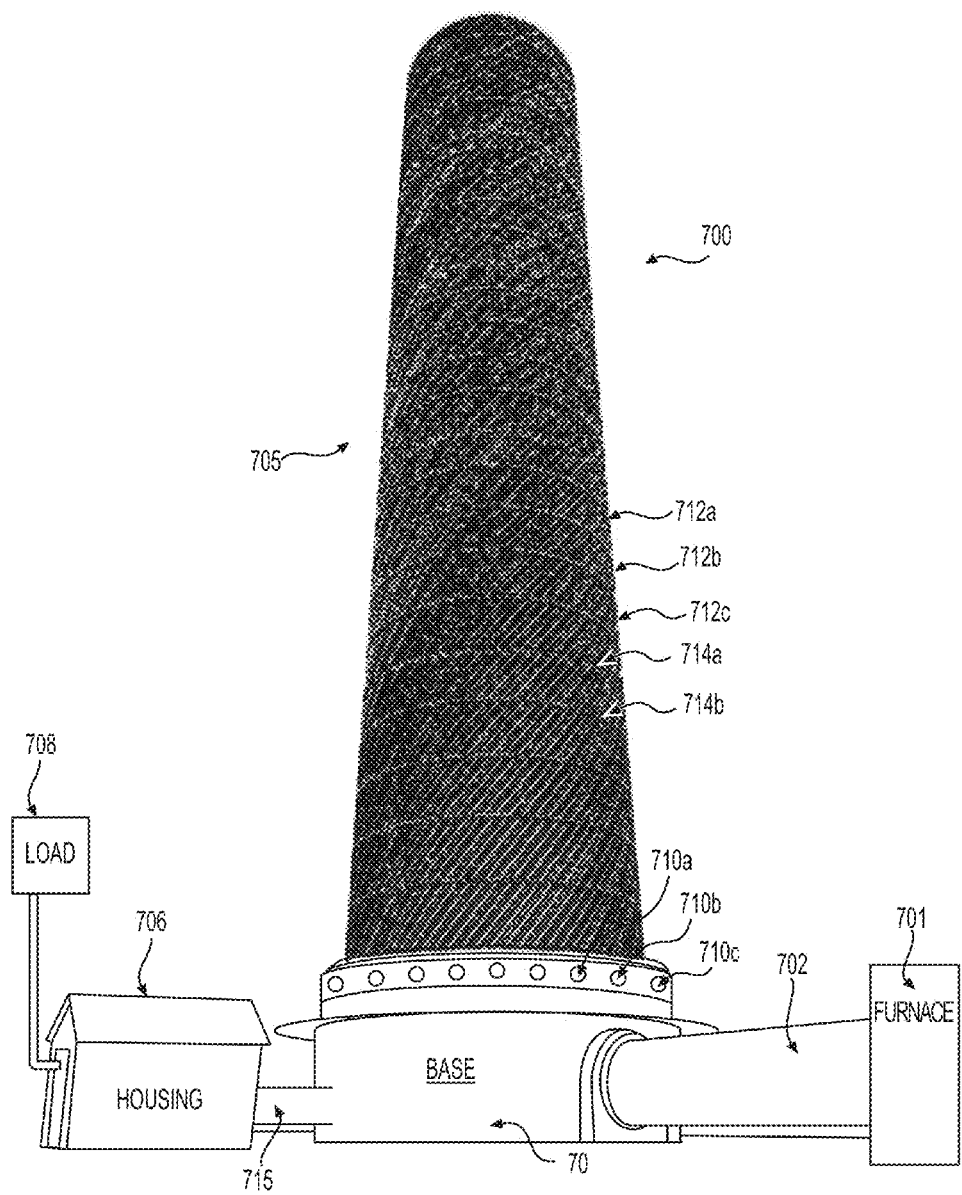
FIG. 7 illustrates a composite ring stack system for converting excess waste heat to electricity according to an embodiment according to an embodiment of the present invention.

FIG. 7 illustrates a composite ring stack system 700 for converting excess waste heat to electricity according to an embodiment of the present invention. In the embodiment illustrated in FIG. 7, waste heat is delivered from a furnace 701 through a portal 702 to a composite ring stack structure 705. Composite ring stack structure 705 comprises a plurality of composite rings, for example, composite rings 712a, 712b, and 712c that are stacked on top of one another. Hot flue gases generated by furnace 701 are directed to the plurality of stack rings under the control of one or more valves, for example, valves 710a, 710b, and 710c. Valves 710a, 710b, and 710c direct hot flue gases into channels formed in composite ring stack structure by stacking composite rings 712a, 712b, and 712c. Composite rings 712a, 712b, and 712c comprise a plurality of composite ring elements, for example, composite ring elements 714a and 714b. In an embodiment, composite ring elements 714a and 714b are substantially wedge-shaped. Composite ring elements 714a and 714b include a NEC film containing collector/converter devices, such as collector/converter device 600 and NEC film 210, to convert heat to electricity.

Figure 10:
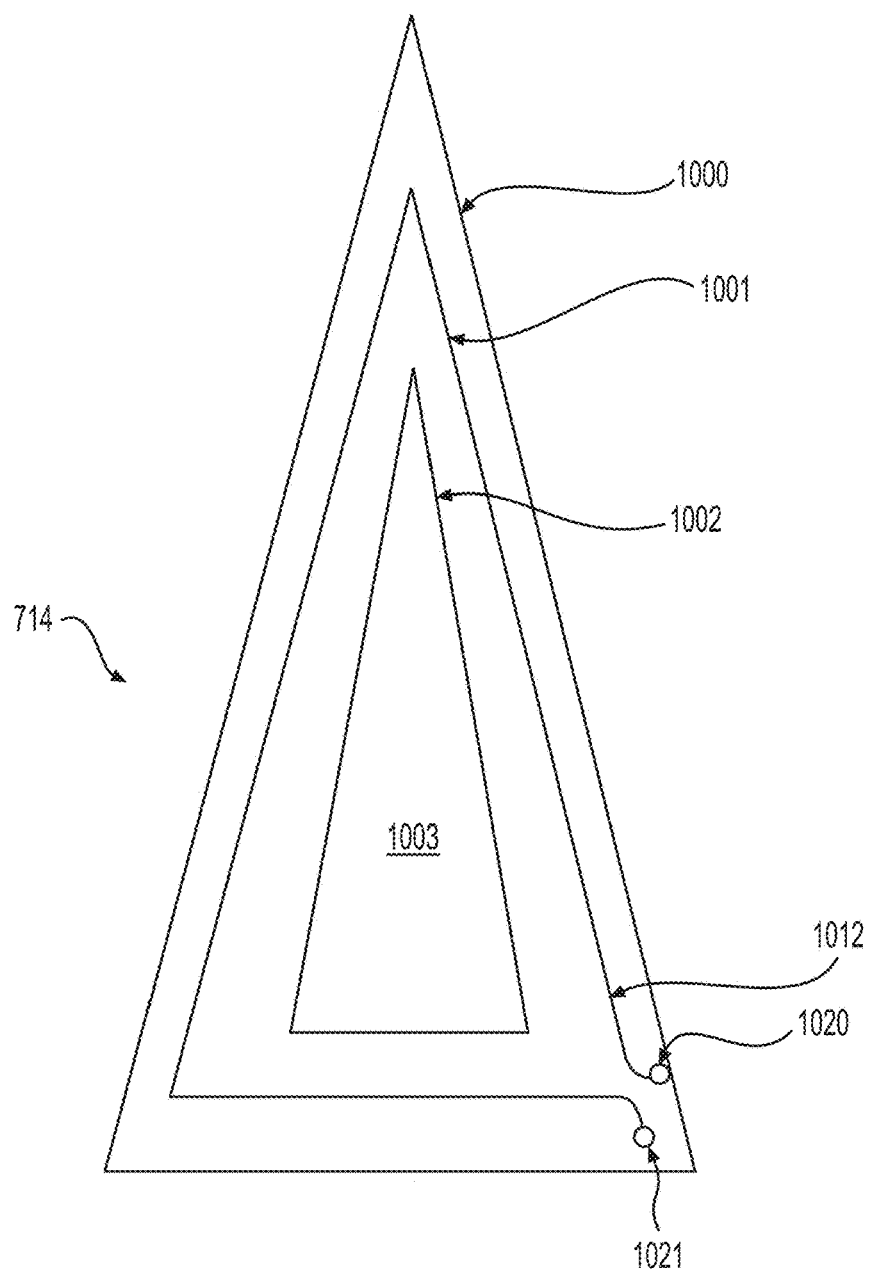
FIG. 10 illustrates a wedge cross section of a stack ring element according to an embodiment of the present invention.

The generated electrical current from the NEC film flows through a bus 715 (FIG. 10 shows connector elements 1020 and 1021) to a power inverter in a housing facility 706. The power inverter converts the DC electrical current generated by the NEC film 210 in the composite ring elements, which is then be supplied to a load 708.

The height of structure 705 will vary depending on the flue gas source temperature and material flow rate. The modular nature of embodiments makes it possible to make stacks of arbitrary height and radius. Manufacturing costs are reduced since the device is composed of a multiplicity of the same components that are joined together, for example, using bolts, screws, nails, bonding material such as glue or cement, and any other way of joining the composite stack rings.

Since collector/converter 106 harvests heat by radiant proximity, more heat is harvested by exposing a greater surface area of collector/converter 106 to heat source 102, in the case, for example, of hot flue gases generated by furnace 701. Composite ring stack system 700 allows for maximum surface area exposure of collector/converter devices to the hot flue gases. It also creates access to cooling of collector/converter 106 for this same surface area. This cooling is provided by air gaps between stack ring elements of the composite stack rings.

Figure 8:
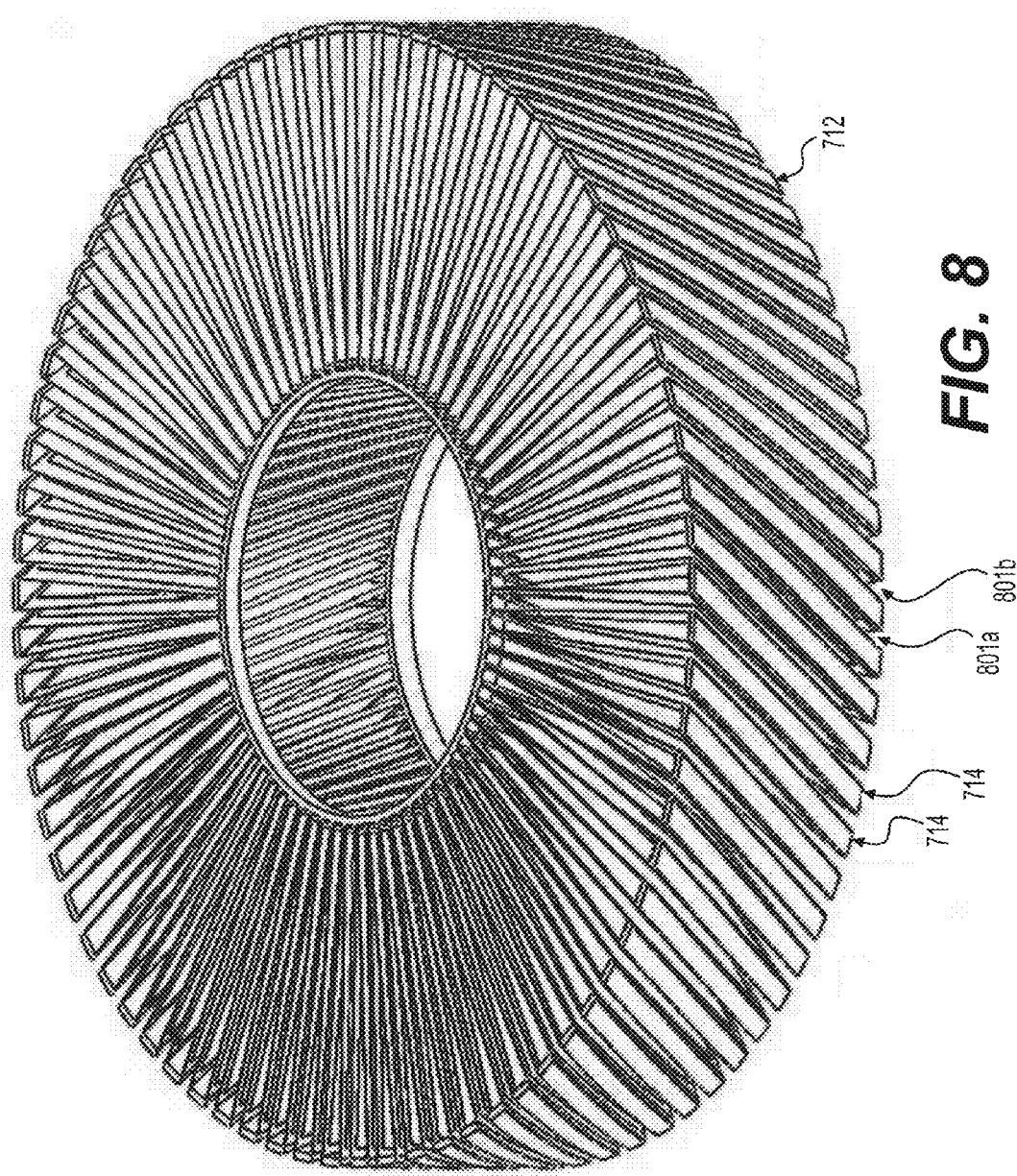
FIG. 8 illustrates a composite stack ring according to an embodiment of the present invention.

FIG. 8 illustrates a composite ring 712, such as composite rings 712a, 712b, or 712c, according to an embodiment. FIG. 8 also illustrates composite ring elements 714, such as composite ring elements 714a and 714b according to an embodiment. A plurality of air gaps between composite ring elements 714, for example, air gaps 801a and 801b, provide a cooling effect to NEC film in the composite rings elements 714 as described above.

Figure 9:
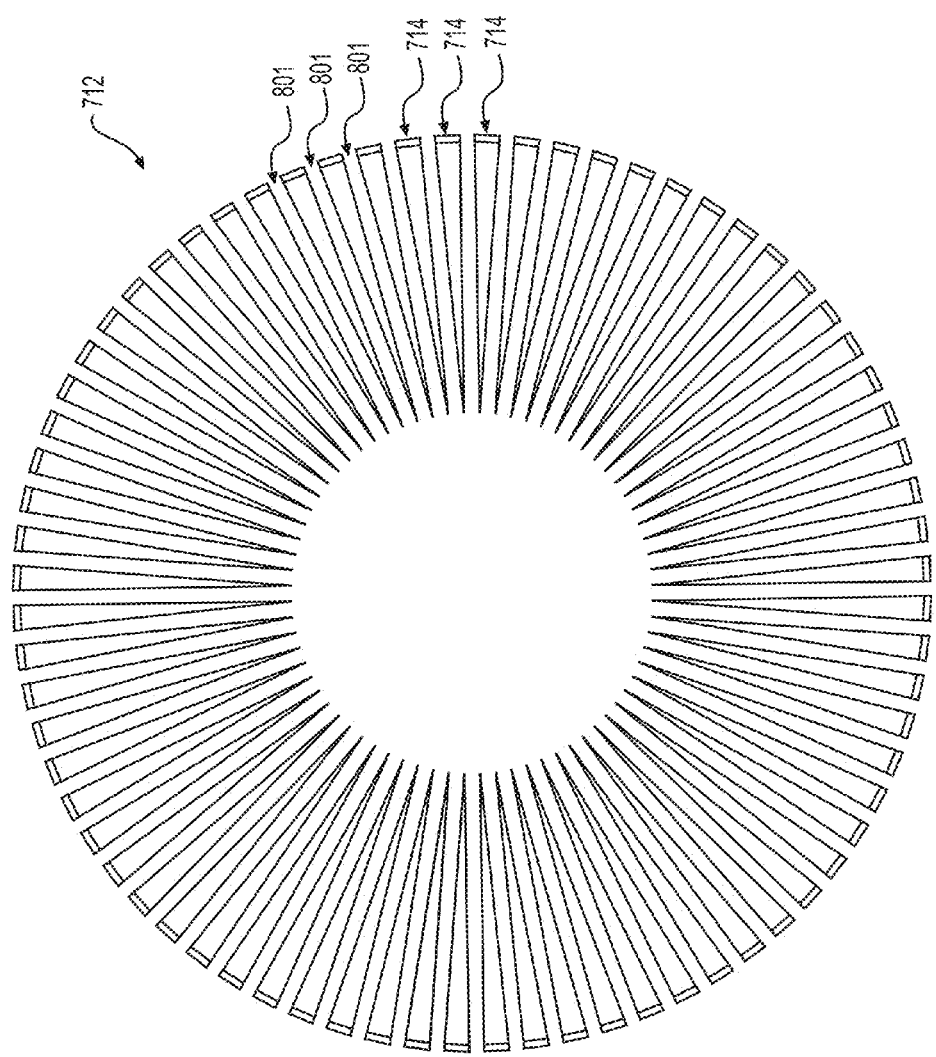
FIG. 9 illustrates a composite stack ring cross section according to an embodiment of the present invention.

FIG. 9 illustrates a cross section through composite ring 712 illustrated in FIG. 8. FIG. 9 illustrates a plurality of composite ring elements 714 and a plurality of air gaps 801 between composite ring elements 714. FIG. 10 illustrates electrical bus connection points, for example, bus connection points 1020 and 1021. Junction points 1020 and 1021 provide points where electricity generated by composite ring stack elements 714 (via NEC film 301 contained within) is added to electrical current generated by other stack elements in different composite rings to be provided to the power inverter in housing 706. Transmission of electrical energy to the power inverter is provided via a collection bus from all stack elements (714).

FIG. 10 illustrates a wedge cross section of a composite ring element 714 according to an embodiment. In the illustrated embodiment, composite ring element 714 comprises three layers of concentric material, outer layer 1000, collector/converter (NEC film) layer 1001, and inner protective layer 1002. In an embodiment, the material of the concentric inner and outer layers is stainless steel, aluminum, titanium, or other suitable material that can absorb and conduct heat as well as is sufficiently durable to withstand heat and stress of the hot flue gasses. The inner layer 1002 may also have an environmental overcoat as further protection against caustic acids, etc. present in region 1003.

In operation, hot flue gases fill an interior 1003 of composite ring element 714, thereby exposing NEC film 1001 to the heat from hot flue gases. In an embodiment, NEC film layer 1001 contains NEC devices or other devices for collecting and converting heat to electricity.

Figure 11:
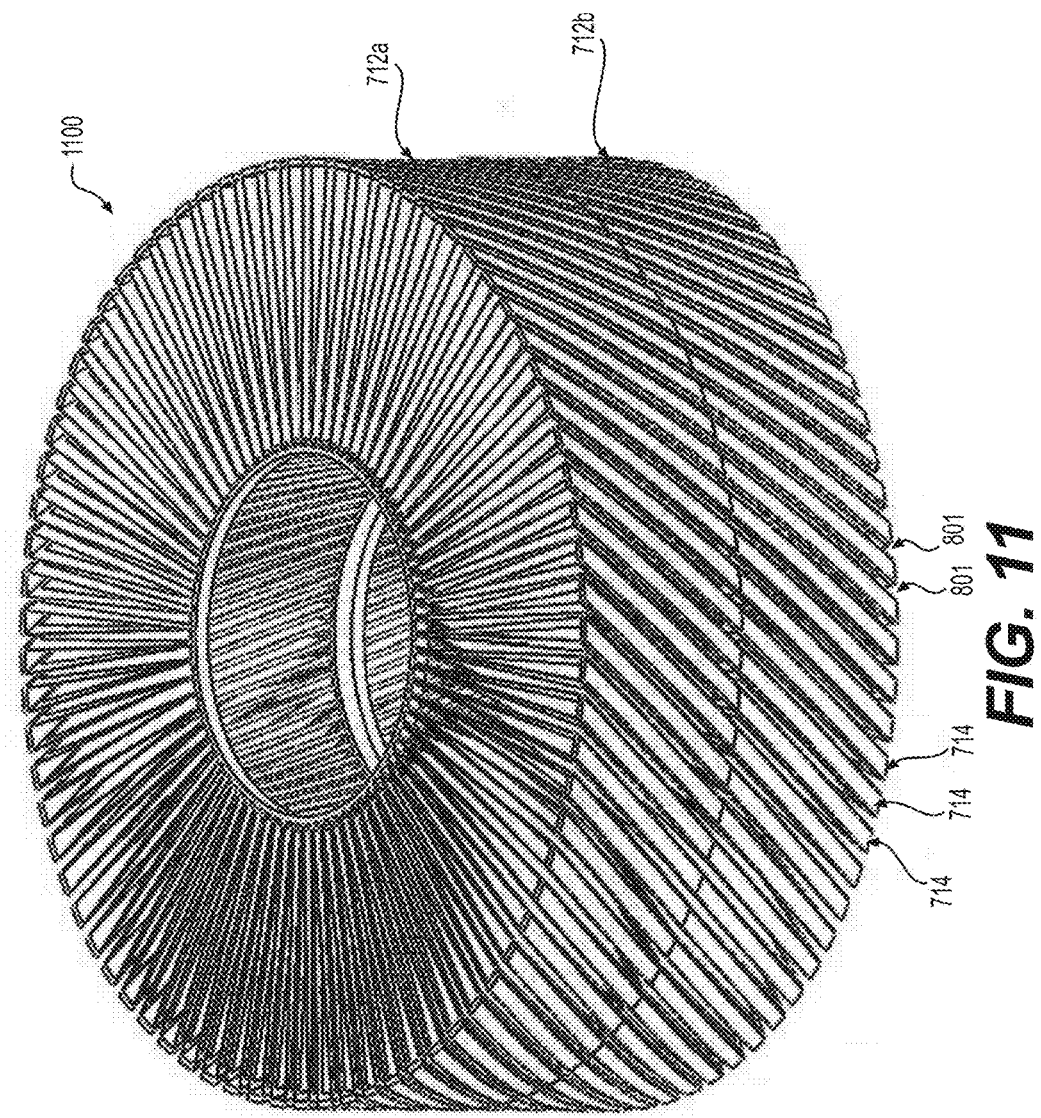
FIG. 11 illustrates two composite stack rings joined together one on top of the next to create a larger composite stack structure according to an embodiment of the present invention.

FIG. 11 illustrates two composite stack rings 712a and 712b joined together one on top of the next to create a larger composite stack structure.

Figure 12:
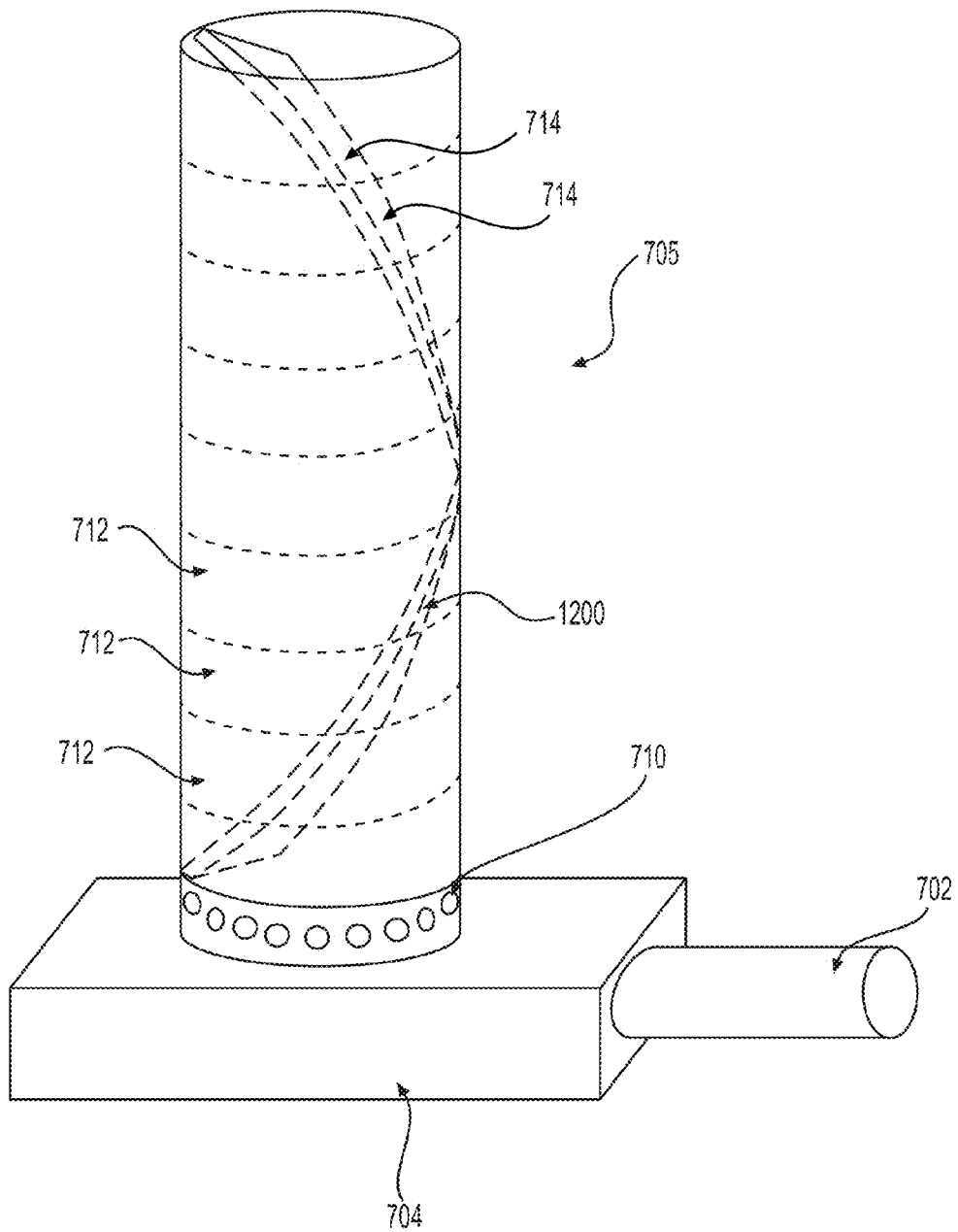
FIG. 12 illustrates flow of gas through a composite ring element channel in a composite ring stack comprising composite stack rings according to an embodiment of the present invention.

FIG. 12 illustrates flow of gas through a composite ring element channel in a composite ring stack 705 of composite rings 712 according to an embodiment of the present invention. Composite ring stack 705 includes a series of composite rings 712 connected vertically. As shown in FIG. 12, composite stack 705 uses a turned (or spiral) topology. That is, successive composite rings 712 are stacked and oriented to align composite ring elements 714 to form spiral channels, such as spiral channel 1200. The spiral channel is one embodiment of the invention, however, other embodiments may or may not use spiral or may have varying pitch of the spiral channels. The turned topology enhances cool air flow into the stack from the environment. As shown in FIG. 12, hot flue gases enter a base 704 through portal 702. The hot flue gases are introduced to a composite stack 705 under the control of valves 710, which provide the hot flue gases to spiral channel 1200. Spiral channel 1200 is a channel through which hot flue gases flow to expose their heat to the NEC film of stack elements 714 of each composite ring 712 that forms spiral channel 1200. Heat is captured and converted to electrical energy by respective collector/converter layers 1001, as described above.

FIG. 7 also illustrates composite stack 705 components base detail according to an embodiment of the present invention. Hot flue gases enter the bottom of the composite stack 705 through portal 702 connected to base 704. In an embodiment, flow to each stack element 714 is controlled by a valve 710. Valve control also allows for maintenance of composite ring elements 714. Electrical outputs from devices in collector/converter layer 1001, such as NECs, of composite ring elements 714 are connected to a power inverter, which is known to those in the art, and housed in facility 706 for conversion to AC current. Output from the power inverter is connected to load 708. Load 708 may be, for instance, the commercial power grid or a local electrical distribution network.

Additional embodiments of this invention are possible in environments containing heated liquids. The design of stack 705 would be modified to the weight, pressure and unique requirements of heated liquid. Heated liquid entering the system would be diverted into a multiplicity of stack elements for maximizing surface area contact. Stack element separation and access to cooling would be maintained by similarly.

The foregoing disclosure of the preferred embodiments of the present invention has been presented for purposes of illustration and description. It is not intended to be exhaustive or to limit the invention to the precise forms disclosed. Many variations and modifications of the embodiments described herein will be apparent to one of ordinary skill in the art in light of the above disclosure. The scope of the invention is to be defined only by the claims appended hereto, and by their equivalents.

Further, in describing representative embodiments of the present invention, the specification may have presented the method and/or process of the present invention as a particular sequence of steps. However, to the extent that the method or process does not rely on the particular order of steps set forth herein, the method or process should not be limited to the particular sequence of steps described. As one of ordinary skill in the art would appreciate, other sequences of steps may be possible. Therefore, the particular order of the steps set forth in the specification should not be construed as limitations on the claims. In addition, the claims directed to the method and/or process of the present invention should not be limited to the performance of their steps in the order written, and one skilled in the art can readily appreciate that the sequences may be varied and still remain within the spirit and scope of the present invention.

What is claimed:

1. A system for converting electromagnetic energy emitted by heat from hot gases into electricity comprising a composite stack, the composite stack comprising a plurality of vertically stacked composite stack rings, wherein each composite stack ring comprises a plurality of composite ring elements, wherein each composite ring element has an interior region through which the hot gases flow, wherein each composite ring element has a plurality of similarly shaped, concentric layers, and wherein each composite ring element comprises a converting layer that converts the electromagnetic energy to electricity, wherein each composite ring element has a wedge shape.

2. The system recited in claim 1, wherein each composite ring element comprises at least two layers, wherein a first layer is exposed to the hot gases that flow through the composite ring element and emit the electromagnetic energy to a second layer that converts the electromagnetic energy to electricity.

3. The system recited in claim 1, wherein each composite ring element comprises at least three layers wherein a first layer is exposed to the hot gases that flow through the composite ring element and emits the electromagnetic energy to a second layer that converts the electromagnetic energy to electricity, and a third layer protects the second layer from the outside environment.

4. The system recited in claim 2, wherein the first layer includes a first surface that facilitates absorption and a second surface that facilitates radiation of the electromagnetic energy.

5. The system recited in claim 1, wherein the converting layer in each composite ring element comprises a thermally conducting material and an insulator material.

6. The system recited in claims 5, wherein the converting layer in each composite ring element comprises a collector/converter device that converts incoming electromagnetic energy to electricity, wherein the collector/converter device comprises elements, and the thermally conducting material preferentially insulates areas around the elements.

7. The system recited in claim 1, wherein the converting layer in each composite ring element incorporates nanoantenna electromagnetic collector devices to convert the electromagnetic energy into electricity.

8. The system recited in claim 1, further comprising a load to which the generated electricity is directed.

9. The system of claim 1, wherein the plurality of composite stack rings are configured such that corresponding composite ring elements in different composite stack rings are aligned to form a spiral path for flow of the hot gases through the composite ring elements.

10. The system of claim 1, wherein the hot gases are directed to the composite ring elements through at least one valve.

11. A system for converting electromagnetic energy emitted by heat from hot gases into electricity comprising a composite stack, the composite stack comprising a plurality of vertically stacked composite stack rings, wherein each composite stack ring comprises a plurality of composite ring elements, wherein each composite ring element has an interior region through which the hot gases flow, wherein each composite ring element is a discrete structure and separated from other composite ring elements by an air gap filled with air, and wherein each composite ring element comprises a converting layer that converts the electromagnetic energy to electricity.

12. The system recited in claim 11, wherein each composite ring element comprises at least two layers, wherein a first layer is exposed to the hot gases that flow through the composite ring element and emit the electromagnetic energy to a second layer that converts the electromagnetic energy to electricity.

13. The system recited in claim 11, wherein each composite ring element comprises at least three layers wherein a first layer is exposed to the hot gases that flow through the composite ring element and emits the electromagnetic energy to a second layer that converts the electromagnetic energy to electricity, and a third layer protects the second layer from the outside environment.

14. The system recited in claim 12, wherein the first layer includes a first surface that facilitates absorption and a second surface that facilitates radiation of the electromagnetic energy.

15. The system recited in claim 11, wherein the converting layer in each composite ring element comprises a thermally conducting material and an insulator material.

16. The system recited in claims 15, wherein the converting layer in each composite ring element comprises a collector/converter device that converts incoming electromagnetic energy to electricity, wherein the collector/converter device comprises elements, and the thermally conducting material preferentially insulates areas around the elements.

17. The system recited in claim 11, wherein the converting layer in each composite ring element incorporates nanoantenna electromagnetic collector devices to convert the electromagnetic energy into electricity.

18. The system recited in claim 11, further comprising a load to which the generated electricity is directed.

* * * * *